United States Patent [19]

Palfreeman et al.

[11] 4,065,735
[45] Dec. 27, 1977

[54] ELECTRICAL FILTERS INCLUDING COUPLED RESONATORS

[75] Inventors: John S. Palfreeman, Brockham; Martin Redwood, Sevenoaks; Frederick W. Smith, Sutton; Richard F. Mitchell, Kingston, all of England

[73] Assignee: U.S. Philips Corporation, New York, N.Y.

[21] Appl. No.: 648,308

[22] Filed: Jan. 12, 1976

[30] Foreign Application Priority Data

Dec. 10, 1975 United Kingdom ............... 1724/75

[51] Int. Cl.² ............... H03H 9/04; H03H 9/26; H03H 9/32; H03H 13/00
[52] U.S. Cl. .................................... 333/72; 310/313; 310/366; 333/30 R
[58] Field of Search ............................... 333/30 R, 72; 310/8-8.3, 9.7, 9.8; 331/107 A

[56] References Cited

U.S. PATENT DOCUMENTS

| B 534,991 | 1/1976 | Weglein | 333/72 |
| 3,753,164 | 8/1973 | De Vries | 333/30 R |
| 3,781,717 | 12/1973 | Keunemund | 333/72 X |
| 3,836,876 | 9/1974 | Marshall et al. | 333/30 R |
| 3,882,430 | 5/1975 | Maerfeld | 333/30 R |
| 3,886,504 | 5/1975 | Hartmann et al. | 333/72 |

Primary Examiner—Alfred E. Smith
Assistant Examiner—Marvin Nussbaum
Attorney, Agent, or Firm—Frank R. Trifari; Bernard Franzblau

[57] ABSTRACT

A surface acoustic wave band-pass filter comprising a piezoelectric substrate having on one surface first and second SAW resonators tuned to the same frequency and coupled together. An input transducer is coupled to the first resonator and an output transducer is coupled to the second resonator. Each resonator is preferably formed by two spaced apart aligned grating reflectors and the two resonators are preferably coupled by an array of discrete parallel metallic strips extending between the two cavity resonators.

13 Claims, 3 Drawing Figures

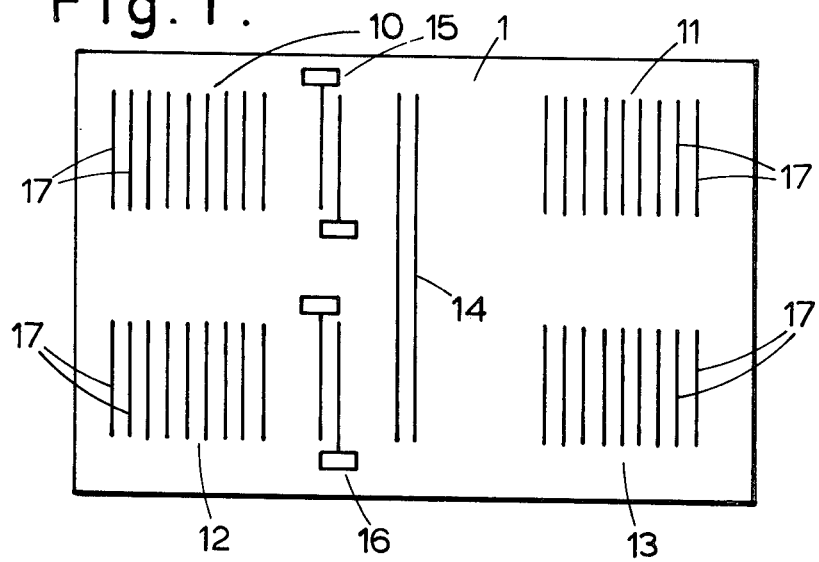
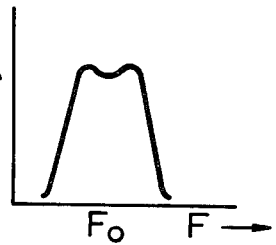
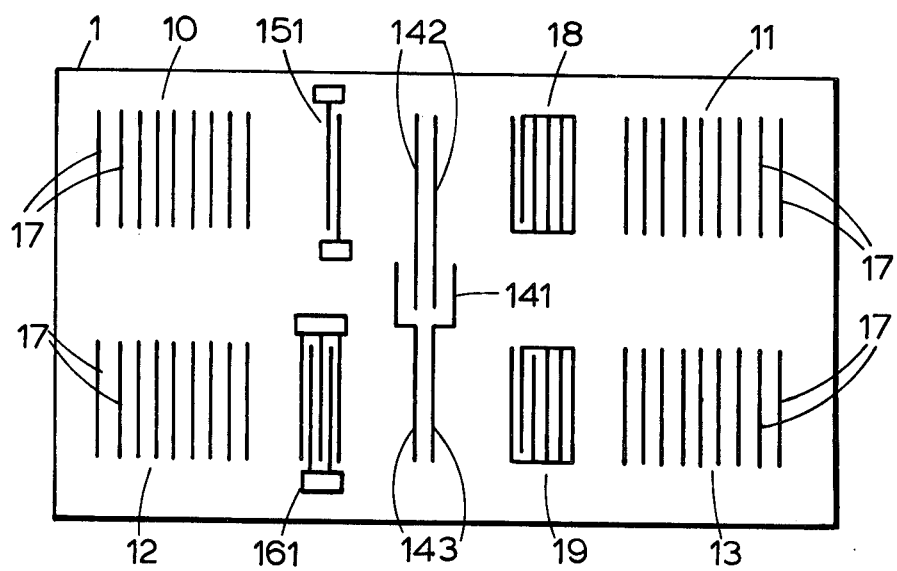

ELECTRICAL FILTERS INCLUDING COUPLED RESONATORS

This invention relates to an electrical filter comprising a plurality of coupled resonators.

More particularly, though not exclusively, the invention relates to electrical filters of the type including two resonators tuned to substantially the same frequency and coupled so that the combined response has a double-resonance band-pass characteristic centred on that frequency. To obtain a filter of this type with a substantially square band-pass characteristic, i.e. with a substantially flat top and sharp cut-off, a well defined degree of coupling is required between the two resonators which must each have a high $Q$ factor, where $Q = fo/\Delta f$; $fo$ being the centre frequency to which each resonator is tuned and $\Delta f$ being the 3db bandwidth of each resonator at the frequency $fo$.

The most well known filter of the above type is that in which the two resonators are L-C resonant electrical circuits coupled via a shared reactance. In this case, for each resonant circuit $Q = X/r$; where $X$ is $2\pi \times$ the energy stored in the resonant circuit and $r$ is the total energy loss per cycle of the resonant circuit at the frequency $fo$. A practical limitation of L-C resonant circuits at high frequencies, i.e., 10 megahertz and above, is that the loss $r$ becomes unavoidably high and lowers the Q factor. For example, the best Q factor obtainable for an L-C resonant circuit is typically less than 1000 at 30 MHz.

A more recently known filter of the type described in the penultimate paragraph is that in which the two resonators are acoustic bulk wave resonators formed with a plate of piezoelectric material. This is now known as the 'monolithic crystal filter' and is described, for example, in Electronics Letters, Vol. 2, No. 6, June 1966, pages 220-222, by M. Redwood and N. H. C. Reilly. Each resonator is formed by two electroded areas on opposite sides of the piezoelectric plate. An electrical signal applied to the two electrodes of the input resonator excites a resonant mechanical vibration in the region of the plate between those electrodes. The two electrodes of the identical output resonator are placed close to those of the input resonator so that the two resonators are acoustically coupled and have a band-pass characteristic centred on the centre frequency of each resonator. The resonant mechanical vibration in the output resonator excites an electrical signal in its two electrodes which provides the output electrical signal of the filter. A practical limitation of these filters is that above about 30 MHz, although the Q factors for the resonators can still be above 100,000, the thickness required for the piezoelectric plate becomes so small that it is difficult to manufacture, and at about 100 MHz the yield of such manufactured devices becomes very low.

An object of the invention is to provide an electrical filter with which it is possible to achieve substantially square band-pass characteristics at higher frequencies that can be obtained with said monolithic crystal filters.

According to the invention there is provided an electrical filter comprising a body of piezoelectric material on one surface of which is arranged a plurality of acoustic surface wave resonators having substantially the same centre frequency, input transducing means arranged to launch acoustic surface wave energy responsive to an input signal into a first resonator for exciting an acoustic surface standing wave therein, output transducing means arranged to receive acoustic surface wave energy from a second resonator for providing an output signal and coupling means between successive resonators for coupling acoustic surface wave energy from one resonator to the next one.

Surface processing techniques, particularly photolithography, are now available which enable acoustic surface wave devices to be made without difficulty which operate at frequencies of 100 MHz and higher. Acoustic surface wave resonators have already been made having a Q factor of 6,000 at 60 MHz, and we consider it possible to make them having Q factors of up to 100,000 at 100 MHz and having Q factors of up to 10,000 at about 1000 MHz.

Each acoustic surface wave resonator preferably comprises two reflectors each constituted by an array of discrete reflecting elements arranged one behind the other. The reflecting elements may be, for example, grooves in or conducting strips on the surface of the piezoelectric body. Such a resonator is known from the "Proceedings of the 1974 Symposium on Frequency Control", Forth Monmouth, N.J., at pages 280-285, "UHF Surface Acoustic Wave Resonators" by E. J. Staples.

The coupling means may be electrical or acoustic. A preferred form of electrical coupling means consists of first and second arrays of discrete parallel conductive strips electrically insulated from each other, the first and second arrays being located in the two successive resonators respectively and being arranged for the transfer of electrical energy from the first to the second array, whereby part of the acoustic surface wave energy across the first array is transferred to be relaunched as acoustic surface wave energy by the second array. An example of such an electrical coupling means for transferring acoustic surface wave energy from a first region to a second region is known from U.K. Patent Specification No. 1,372,235 in which there is described a single array of at least several filamentary conductors extending over the first region and over the second region. The first and second arrays in the preferred electrical coupling means of the present invention could be formed as a single array in the manner described in U.K. Patent Specification No. 1,372,235. However, they could also be formed separately and arranged to overlap in the region between the two resonators so that the transfer of electrical energy from the first to the second array is by capacitive coupling. This embodiment has the advantage that trimming the coupling between the two resonators and hence the band-pass characteristics of the filter can be achieved in an easy way by removing a part of the arrays in the overlap region.

The input transducing means arranged to launch acoustic surface wave energy into the first resonator and the output transducing means arranged to receive acoustic surface wave energy from the second resonator are preferably located within the first and second resonators respectively. The input and output transducing means can each be constituted by a single interdigital transducer whose design must be such that it will respectively launch or receive acoustic surface wave energy at the centre frequency of its respective resonator. The interdigital transducers could be arranged to have a maximum response at a frequency other than the centre frequency of their respective resonators, and this provides one means of varying the strength of coupling between the transducers and the resonators and hence the impedance characteristics of the resonators.

The input and output transducing means and the coupling means are preferably arranged so that the input and output transducing means are substantially not coupled by this coupling means at frequencies outside the required frequency response of the filter. This is desirable to avoid a transfer from the first to the second resonator of acoustic surface wave energy launched by the input transducing means outside the required band-pass frequency limits of the filter.

Means can be provided within each of the resonators which enable the centre frequency of the resonators and hence the band-pass characteristic of the filter to be trimmed. This means can be, for example, a pad, e.g., a metal pad, or an extra transducer whose presence affects the velocity of acoustic surface waves in the respective resonator and hence the centre frequency of that resonator. Removal of a part of the metal pad or extra transducer, or a change in an adjustable impedance in an external electrical circuit connected to the extra transducer is thus a possible means of frequency trimming the resonators.

The coupling means or the input and output interdigital transducers respectively within the first and second resonators, or the extra transducers within the resonators can be located with respect to the maxima and minima of acoustic intensity of the acoustic surface standing waves in the resonators so that tey do not couple with maximum efficiency to those standing waves. This enables the coupling between the resonators to be trimmed in small increments; or the input and output transducers to have an impedance required for the input and output electrical circuits of the filter as well as a strength of coupling required for the impedance characteristics of the resonators; or part of the extra transducers to be removed in small increments to trim the frequency of the resonators.

Embodiments of the invention will now be described in more detail with reference to the accompanying drawings, in which:

FIG. 1 shows schematically in plan view an electrical filter including two coupled acoustic surface wave resonators, FIG. 2 shows the band-pass amplitude frequency response of the filter shown in FIG. 1, FIG. 3 shows schematically in plan view another electrical filter including two coupled acoustic surface wave resonators, illustrating some possible variations of the features of the filter shown in FIG. 1 within the scope of the invention, and FIG. 4 shows another electric filter having a pair of extra transducers coupled to an external electric circuit.

Referring now to FIG. 1, there is shown a body 1 of piezoelectric material capable of propagating and supporting acoustic surface waves, e.g., Y cut Z propagating lithium niobate, on the upper surface of which is formed a first acoustic surface wave resonator comprising two reflectors 10 and 11; a second, similar, acoustic surface wave resonator comprising two reflectors 12 and 13; an array 14 of parallel conductive strips which electrically couples the two resonators; an input transducer 15 and an output transducer 16.

The distance between the two reflectors 10 and 11 of the first resonator is chosen so that they form a cavity capable of supporting a resonant acoustic surface standing wave in the cavity at a frequency fo when acoustic surface wave energy is launched into the cavity between the two reflectors 10 and 11 by the input transducer 15 at the frequency $f_o$. The length of the cavity will be substantially an integral number of half wavelengths of acoustic surface waves at the required centre frequency $f_o$ of that resonator, for example ten wavelengths.

Each of the reflectors 10 and 11 is constituted by an array of discrete reflecting elements 17 arranged one behind the other. The reflecting elements 17 may be, for example, grooves in or conducting strips on the surface of the body 1. The reflecting elements 17 are preferablly periodically arranged as a grating with the centre-to-centre spacing between the reflecting elements 17 essentially half a wavelength $\lambda/2$ or an integral number of half wavelengths at the required centre frequency $f_o$. The number of reflecting elements 17 in each reflector 10 and 11 is chosen to give a high reflection coefficient of acoustic surface wave energy from each reflector 10 and 11. In a typical example the reflecting elements 17 would be grooves 0.015 $\lambda$ deep, and the spacing between the grooves would be essentially the same as their width, i.e., $\lambda/4$, although the precise spacing would have to take into account the phase change of the acoustic surface wave which occurs on reflection from each groove in order to ensure that reflections from all the grooves of a reflector are in phase at the edge of the cavity between the two reflectors. The length of the grooves is typically 100 $\lambda$ to ensure that the diffraction losses from the acoustic surface waves propagating between the two reflectors are low. In a typical example the number of grooves in each reflector 10 and 11 is about 200 which gives a reflection coefficient greater than 90% for each reflector. The low losses associated with this reflection coefficient result in the resonator having a high Q factor.

The second resonator formed by the reflectors 12 and 13 is similar to the first resonator formed by the reflectors 10 and 11 just described.

The array 14 of discrete parallel conductive strips electrically insulated from each other is located in the first and second resonator cavities and extends between them. Part of the energy of the acoustic surface standing wave across the array 14 in the first resonator formed by the reflectors 10 and 11 is transferred as electrical energy by the strips of the array 14 to be relaunched as acoustic surface wave energy in the second resonator formed by the reflectors 12 and 13. An acoustic surface standing wave is thereby set up in the second resonator at its centre frequency $f_o$ and acoustic surface wave energy in this standing wave is received by the output transducer 16. The centre-to-centre spacing of the strips of the array 14 can be $\lambda/2$ at the frequency $f_o$. However, if the spacing of the strips is less than $\lambda/2$ at the frequency $f_o$ the array 14 will be directional. By directional is meant the ability of the array 13 to relaunch acoustic surface wave energy received from the input transducer 15 in the same direction, i.e., towards the reflector 13 rather than towards the reflector 12. The number of strips in the array 14 is one of the factors determining the amount of coupling between the two resonators, which will be discussed in more detail later, but it could be as little as two strips as shown. If there are only two strips in the array 14 the coupling between the two resonators will be weak and the array will have a low degree of directionality. If the number of strips in the array 14 is increased a point will be reached where the array has a high degree of directionality which remains as the number of strips is further increased. If the number of strips in the array 14 is increased the amount of coupling between the two resonators will also increase at first, but will then decrease and increase cyclically.

The design of the input and output transducers 15 and 16 must be such that they will respectively launch or receive acoustic surface wave energy at the centre frequency $fo$ of the respective resonators in which they are located. In the simplest case they can each be constituted by a single interdigital transducer having two fingers of the same length whose width is the same as the spacing between them and is $\lambda/4$ at the frequency $fo$. In this case the amplitude-frequency response of each transducer 15 and 16 is the conventional $\sin x/x$ form with a maximum response at the frequency $fo$. Capacitive cross-talk between the two transducers 15 and 16 can be reduced by providing a grounded metallic strip on the body 1 between them.

The first and second resonators can with advantage be close together to reduce the amount of energy lost from the part of the coupling array 14 which is not located within either resonator, but at the same time the first and second resonators can be sufficiently far apart to give a low level of diffraction cross-talk between them. Diffraction cross-talk between the resonators can also be reduced by damping it with an absorbent material placed on the surface of the body 1 between the two resonators.

With an electrical input signal applied to the terminals of the input transducer 15 and an electrical output taken from the terminals of the output transducer 16, the device described above with reference to FIG. 1 functions as an electrical filter of the known type including two resonators tuned to the same frequency $fo$ and coupled so that the combined response has a double-resonance band-pass characteristic of amplitude A against frequency $f$ centred on the frequency $fo$. This characteristic is shown in FIG. 2. As is known, to obtain a filter of this type with a square band-pass characteristic, i.e., with a flat top and a sharp cut-off, a well-defined degree of coupling is required between the two resonators which must each have a high Q factor. In the device described above with reference to FIG. 1 the degree of coupling between the two resonators is essentially well-defined by the choice of the number of strips in the coupling array 14, and the two resonators each have a high Q factor which is essentially due to the high reflection coefficient of the reflectors as has been explained.

The simple interdigital input and output transducers 15 and 16 shown in FIG. 1 will have a broad-band response over a frequency range beyond the required band-pass frequency limits of the filter. If the number of strips in the array 14 and the spacing between those strips is such that there is a high degree of directionality, then with the transducers 15 and 16 arranged on the same side of the coupling array 14 they are substantially not coupled by the array 14. This avoids a transfer from the first to the second resonator of acoustic surface wave energy launched by the input transducer 15 outside the required band-pass frequency limits of the filter.

The wavelength $\lambda$ of acoustic surface waves on Y cut Z propagation lithium niobate is approximately 50 $\mu$ at 60 MHz. In this case, the filter shown in FIG. 1 having the typical design details described above would have an overall length of 1.25cm and an overall width of 1cm.

Some possible variations of the features of the filter shown in FIG. 1 will now be described with reference to FIG. 3. The first and second resonators formed by the reflectors 10 and 11 and by the reflectors 12 and 13 respectively are the same as shown in FIG. 1. However, the means 141 for coupling the two resonators is different from the single array 14 shown in FIG. 1 and the input and output transducers 151 and 161 are different from the input and output transducers 15 and 16 shown in FIG. 1. Also, an extra transducer 18 is located within the cavity of the first resonator and an extra transducer 19 is located within the cavity of the second resonator.

The means 141 for coupling the two resonators consists of a first array 142 of conductive strips located in the first resonator and a separate second array 143 of an equal number of conductive strips located in the second resonator. The two arrays are arranged to overlap in the region between the two resonators so that the transfer of electrical energy from the first array 142 to the second array 143 is by capacitive coupling. In this case, removal of a part of the arrays in the overlap region, e.g., by burning with a laser beam, is one possible means of trimming the coupling between the two resonators and hence the band-pass characterstic of the filter. Another possible means of trimming the coupling between the two resonators can be provided by having a single array of conductive strips 14 as shown in FIG. 1, with a centre-to-centre spacing of $\lambda/2$ at the frequency $fo$, with the strips located with respect to the maxima and minima of acoustic intensity of the acoustic standing waves in the resonators so that they do not couple with the maximum efficiency to those standing waves, and with a larger number of strips than that which would provide the same degree of coupling if placed so as to couple with the maximum efficiency to those standing waves. Alternatively, a reduced degree of coupling with a larger number of strips in a single array 14 can be achieved by utilising the cyclic variation in the degree of coupling as the number of strips is increased. In either case, this enables the coupling between the two resonators to be trimmed in small increments by breaking some of the strips of the array, e.g. by burning with a laser beam. Yet another possible means of trimming the couplings between the two resonators can be provided by having a single array of conductive strips, for example the array 14 as shown in FIG. 1, with an external circuit or circuits including an adjustable impedance connected to the array. Adjusting the external circuit or circuits then varies the degree of coupling provided by the array.

The interdigital transducers 151 and 161 shown in FIG. 3 are arranged to have a maximum response at a frequency other than the centre frequency of their respective resonators, illustrated in FIG. 3 by showing the fingers of the transducers closer together than in FIG. 1. This provides one means of varying the strength of coupling between the transducers and the resonators and hence the impedance characteristics of the resonators. The interdigital transducers 151 and 161 shown in FIG. 3 are of different sizes, i.e., they are made of different numbers of fingers; and they also are located in different positions within their respective resonators, i.e., they may be located with respect to the maxima and minima of acoustic intensity of the acoustic standing waves in the resonators so that they do not couple with the maximum efficiency to those standing waves. This enables the input and output transducers to have an impedance required for the input and output electrical circuits of the filter as well as a strength of coupling required for the impedance characteristics of the resonators.

The extra transducers 18 and 19 within the resonators shown in FIG. 3 provide a means for trimming the centre frequency of the resonators and hence the bandpass characteristic of the filter. The presence of the extra transducers affects the velocity of acoustic surface waves in the respective resonator and hence the centre frequency of that resonator. The transducers 18 and 19 can be provided with their fingers short circuited so that some of them can be open circuited, e.g., by burning with a laser beam, to effect the frequency trimming as shown in FIG. 3. Otherwise, the extra transducers can be connected to external electrical circuits so that these circuits can be adjusted to effect the frequency trimming as shown in FIG. 4. In either case the extra transducers can be located with respect to the maxima and minima of acoustic intensity of the acoustic surface standing waves in the resonators so that they do not couple with maximum efficiency to those standing waves, whereby the frequency of the resonators can be trimmed in small increments.

If the reflecting elements of the reflectors 11 and 13 are formed by grooves in the surface of the body 1, then the extra transducers 18 and 19 can be placed on the lands between the grooves as long as they are still within the effective cavity.

Another possible means for frequency trimming the resonators is the provision of a pad, for example a conductive pad, within each resonator whose presence affects the velocity of acoustic surface waves in the respective resonator and hence the centre frequency of that resonator. Removal of a part of the metal, e.g. by burning with a laser beam, will effect the required frequency trimming.

Some further possible variations from the filter described with reference to FIG. 1 are as follows.

The input and output transducers 15 and 16 are shown in FIG. 1 located within their respective resonator cavities and arranged so that they are not coupled by the coupling means. This is a preferred arrangement but is not essential. They could be located outside their respective resonator cavities so that they launch into and receive from their respective resonators by transmission underneath one of the grating reflectors. Furthermore, the filter device could still be operative even if there were a certain amount of coupling between the input and output transducers.

The array of conductive strips 14 shown in FIG. 1 is a preferred form of electrical coupling means for effecting a transfer of acoustic surface wave energy from the first to the second resonator. Other forms of electrical coupling means could be an extra transducer located in each resonator, the two extra transducers being electrically connected as shown in U.S. Pat. No. 3,886,504; or a single extra transducer which extends across the two resonators; or an external circuit impedance connecting the input and output transducers 15 and 16; or the arrangement of the two resonators sufficiently close together to allow capacitive breakthrough coupling between the input and output transducers 15 and 16. Furthermore, the means for coupling the first and second resonators may be acoustic rather than electrical. For example, where the two resonator cavities are parallel as shown in FIG. 1, two acoustic reflectors, each in the form of a grating similar to the gratings 10, 11, 12 and 13 but consisting of fewer elements so as to have a low reflection coefficient, are placed one in each cavity at appropriate angles to the cavity propagation direction and to each other. The reflection coefficients of these two reflectors are chosen to give the required degree of coupling between the two resonators. Another possibility is to arrange the two resonators with their cavities intersecting at 90° and coupled by a single acoustic reflector placed at 45 degrees to both cavities. Yet a further possibility is to form the two resonators by arranging three grating reflectors, each similar to the gratings 10, 11, 12 and 13 in a single row. In this case the middle reflector is shared by the two resonators and the small amount of acoustic surface wave energy transmitted underneath the middle reflector couples the two resonators.

The two resonators shown in FIG. 1 each comprise two reflectors each constituted by an array of discrete reflecting elements arranged one behind the other. This is the preferred form for the reflectors. However, it is possible to use other forms of acoustic surface wave reflectors, for example transducers or folded directional couplers.

The filter shown in FIG. 1 includes two coupled acoustic surface wave resonators each having the same centre frequency, and this is considered to be the most advantageous use of such coupled resonators. However, it is possible within the scope of this invention to make an electrical filter including more than two coupled acoustic surface wave resonators. For example, a third resonator can be included between the first and second resonators, the first resonator being coupled to this third one and this third one being coupled to the second resonator. Also within the scope of this invention the two or more resonators need not all have exactly the same centre frequency. Their centre frequencies can vary over a small range which would still enable the coupling to take place to produce a required overall frequency response for the filter.

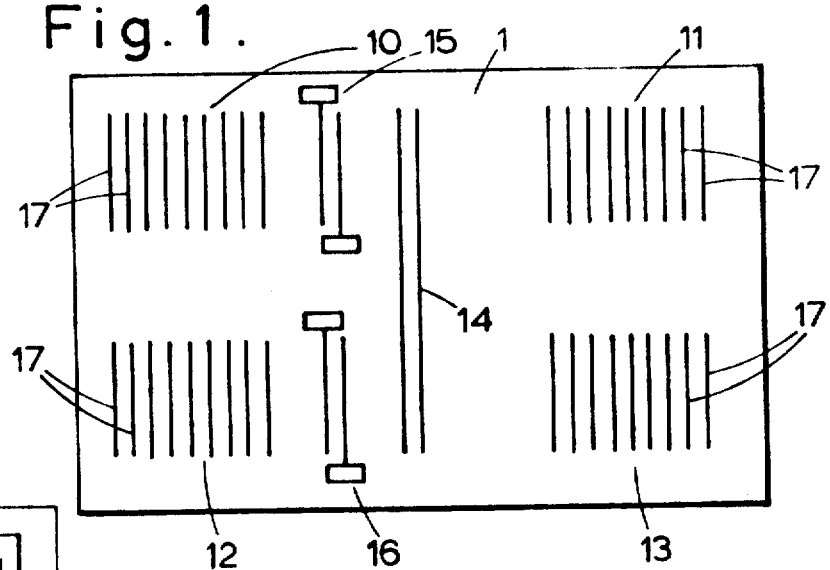
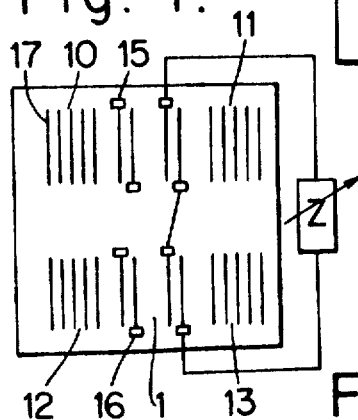
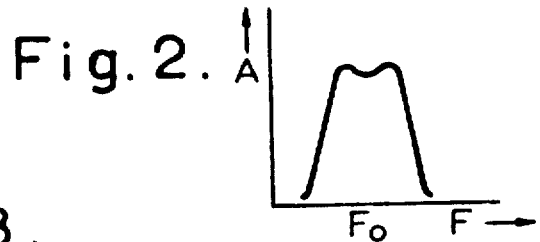
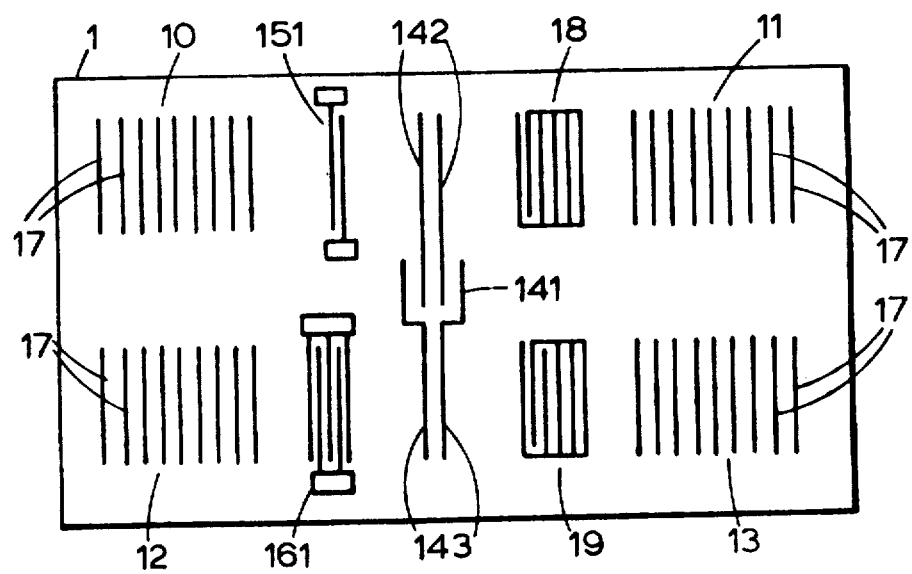

What is claimed is:

1. A surface acoustic wave electrical filter comprising a body of piezoelectric material on one surface of which is arranged a plurality of coupled acoustic surface wave resonators each having substantially the same centre frequency, input transducing means coupled to said one surface for converting an input electric signal into acoustic surface wave energy propagating along said one surface and into a first of said resonators for exciting a resonant acoustic surface standing wave therein, output transducing means coupled to said one surface and arranged to receive acoustic surface wave energy from a second resonator for deriving an output signal, each of said first and second acoustic surface wave resonators comprising two spaced apart reflectors aligned in tandem with each reflector comprising an array of discrete parallel reflecting elements, and coupling means between said first and second resonators for coupling acoustic surface wave energy from one resonator to the next one, said coupling means comprising first and second arrays of discrete parallel conductive strips on said one surface and electrically insulated from each other, the first and second arrays being individually located in the first and second resonators respectively and being arranged to transfer electrical energy from the first to the second array, whereby part of the acoustic surface wave energy across the first array is transferred to be relaunched as acoustic surface wave energy by the second array.

2. A filter as claimed in claim 1 wherein the first and second coupling arrays are formed separately and are arranged to overlap in the region between the first and second resonators so that the transfer of electrical energy from the first to the second array is by capacitive coupling.

3. An electric filter comprising, substrate means having a piezoelectric surface, an input transducer for launching acoustic surface waves on said piezoelectric surface in response to input electric energy, an input acoustic surface wave resonator provided on said piezoelectric surface and responsive to acoustic surface waves launched by the input transducer for providing a standing wave resonance pattern therein, an output acoustic surface wave resonator provided on said piezoelectric surface in juxtaposed spaced relationship with said input resonator, coupling means extending between the input and output resonators to couple acoustic energy therebetween for exciting a standing wave resonance pattern in the output resonator, an output transducer coupled to said piezoelectric surface and responsive to the standing wave resonance pattern in the output resonator for producing output electric energy, said input and output resonators each includng a pair of spaced apart reflective grating structures which define the center frequency of the standing wave pattern in the respective resonator, and acoustic surface wave velocity changing means disposed on the piezoelectric surface within each of said input and output resonators and being adjustable to change the effective velocity of acoustic surface waves within its respective resonator and thereby change the center frequency of the standing wave pattern within the respective resonator.

4. A filter as claimed in claim 3 wherein the velocity changing means for trimming the centre frequency of the resonator comprises an extra transducer within each resonator.

5. A filter as claimed in claim 4, characterized in that the extra transducer is located with respect to the maxima and minima of acoustic energy of the acoustic surface standing waves in the respective resonator so that it does not couple with maximum efficiency to said standing waves.

6. A filter as claimed in claim 4 further comprising an external electrical circuit connected to at least one said extra transducer and including an adjustable impedance for trimming the centre frequency of the corresponding resonator.

7. An electric filter as claimed in claim 3 wherein said coupling means includes an external electric circuit having an adjustable electric impedance for varying the coupling between the input and output resonators.

8. An electric filter comprising, a substrate having a piezoelectric surface, first and second acoustic surface wave resonators arranged on said piezoelectric surface in spaced apart relationship, an input transducer coupled to said piezoelectric surface for propagating acoustic surface waves into said first resonator thereby to excite a resonant acoustic surface standing wave pattern therein, each of said first and second resonators comprising a pair of aligned spaced apart acoustic surface wave reflector structures, means for coupling energy between said first and second resonators, an output transducer coupled to said piezoelectric surface so as to receive acoustic surface wave energy from an acoustic standing wave pattern excited in the second resonator, and an external electric circuit connected to said energy coupling means and including an impedance which determines the degree of coupling between the resonators.

9. A filter as claimed in claim 8, characterized in that the transducers are arranged to have a maximum response at a frequency other than the centre frequency of their respective resonators.

10. An electric filter as claimed in claim 8 wherein said energy coupling means comprises first and second transducers coupled to said piezoelectric surface and located within said first and second resonators, respectively, and said external electric circuit is connected to at least one of said first and second transducers.

11. An electric filter comprising, a substrate having a piezoelectric surface, first and second acoustic surface wave resonator structures arranged on said piezoelectric surface in spaced apart relationship, an input transducer electrode structure coupled to said piezoelectric surface for propagating acoustic surface waves into said first resonator thereby to excite a resonant acoustic surface standing wave pattern therein, each of said first and second resonators comprising a pair of aligned spaced apart acoustic surface wave reflector structures, a coupling means electrode structure for coupling acoustic surface wave energy between said first and second resonators for exciting a resonant acoustic surface standing wave pattern in the second resonator, an output transducer electrode structure coupled to said piezoelectric surface so as to receive acoustic surface wave energy from an acoustic standing wave pattern excited in the second resonator, and wherein at least one of said electrode structures has its electrode elements located on the piezoelectric surface so as not to couple with maximum efficiency to the maxima of the acoustic energy of the respective resonant standing wave pattern.

12. A filter as claimed in claim 11 wherein said one electrode structure comprises the coupling means electrode structure and which is located with respect to the maxima and minima of acoustic energy of the acoustic standing waves in the resonators so that it does not couple with maximum efficiency to said standing waves.

13. A filter as claimed in claim 11, characterized in that the input and output transducers are located within the first and second resonators respectively and are located with respect to the maxima and minima of acoustic energy of the acoustic standing waves in the resonators so that they do not couple with maximum efficiency to said standing waves.

* * * * *

UNITED STATES PATENT OFFICE
CERTIFICATE OF CORRECTION

Patent No. 4,065,735　　　　　　　　　　Dated December 27, 1977

Inventor(s) JOHN S. PALFREEMAN ET AL

It is certified that error appears in the above-identified patent and that said Letters Patent are hereby corrected as shown below:

IN THE DRAWING

The one sheet of drawing should be deleted and substituted with the attached sheet therefore.

IN THE TITLE PAGE

In Section [30] "Dec. 10, 1975　　United Kingdom　　1724/75"

should read

--January 15, 1975　United Kingdom　1724/75
December 10, 1975　United Kingdom　1724/75--

Signed and Sealed this

*Ninth* Day of *January 1979*

[SEAL]

Attest:

RUTH C. MASON　　　　　　　　　　DONALD W. BANNER
*Attesting Officer*　　　　　　　　*Commissioner of Patents and Trademarks*